United States Patent [19]

Miller

[11] 3,980,905

[45] Sept. 14, 1976

[54] APPARATUS AND METHOD FOR TUNING A BROAD BANDWIDTH TRANSDUCER ARRAY

[75] Inventor: Harry B. Miller, Niantic, Conn.

[73] Assignee: The United States of America as represented by the Secretary of the Navy, Washington, D.C.

[22] Filed: Oct. 19, 1973

[21] Appl. No.: 408,136

[52] U.S. Cl. .................................... 310/8.1; 310/26; 318/116; 318/118

[51] Int. Cl.² ........................................ H01L 41/08

[58] Field of Search ............... 310/8.1, 26; 318/116, 318/118; 340/17; 181/.5 AG, .5 EM, .5 J

[56] References Cited

UNITED STATES PATENTS

| | | | |
|---|---|---|---|
| 1,587,098 | 6/1926 | Whittle | 310/8.1 X |
| 2,872,578 | 2/1959 | Kaplan et al. | 318/118 X |
| 3,129,366 | 4/1964 | Fry | 318/118 X |
| 3,315,102 | 4/1967 | Quint et al. | 310/8.1 |
| 3,432,691 | 3/1969 | Shoh | 310/8.1 |
| 3,489,930 | 1/1970 | Shoh | 310/8.1 |
| 3,526,792 | 9/1970 | Shoh | 310/8.1 |
| 3,609,415 | 9/1971 | Kawada | 310/8.1 |
| 3,679,918 | 7/1972 | Keizi | 310/8.1 |
| 3,681,626 | 8/1972 | Puskas | 310/8.1 |

*Primary Examiner*—Mark O. Budd

*Attorney, Agent, or Firm*—Richard S. Sciascia; Arthur A. McGill; Prithvi C. Lall

[57] ABSTRACT

A fixed electrical network, in conjunction with an amplifier having variable output impedance, is used to provide each of the transducer elements of an array with a reactance which acts as a large shunt reactance when the amplifier acts as a constant current source, but which acts as a smaller series reactance when the amplifier acts as a constant voltage source. Consequently, the usable bandwidth of the array is greatly increased, without degrading its performance.

8 Claims, 22 Drawing Figures

APPARATUS AND METHOD FOR TUNING A BROAD BANDWIDTH TRANSDUCER ARRAY

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

This invention relates to transducer arrays and more specifically to an apparatus and method for tuning and driving a transducer array over a broad bandwidth.

When a plurality of transducer elements in a transducer array are energized, their mutual interaction tends to degrade the performance of the transducer array. Degradation of performance becomes worse as the operating bandwidth increases. It is desirable to improve the performance of the transducer array in regard to an increase in its operating bandwidth.

As an example, it has been found that when a piezoelectric transducer is tuned with a simple parallel inductor and driven by a constant current source, the resulting dissymmetrical bandpass filter has a modified response. In this response the output quantity is the velocity of the radiating face of the transducer element and the input quantity is the driving electric current. This response, unlike that of a symmetrical filter, seems to be multiplied by the envelope of a rolling-off high-pass filter. This indicates that higher harmonics will be passed. Conversely, when this transducer element is electrically tuned with a simple series inductor and driven by a constant voltage source, the resulting dissymmetrical bandpass filter has a response which seems to be multiplied by the envelope of a rolling-off low-pass filter. This indicates that higher harmonics will be attenuated. This demonstration can be made by velocity and impedance measurements of an actual transducer element in water, or by a lumped equivalent circuit analog, or by a distributed-parameters simulation of the transducer element by a digital computer.

Although the pass band, i.e., frequency range, for velocity of this bandpass filter can be in the neighborhood of an octave in some designs, the pass band for mechanical input impedance, hereinafter called $Z_{Th}$, will be only about half an octave, i.e., $Z_{Th}$ will have an acceptably high magnitude for good array performance over only about half of the octave pass band. Moreover, the electric input impedance, hereinafter called $Z_{in}$, will have a sufficiently low phase angle, which implies supplying volt-amps at a high power factor, over only about half of the octave pass band.

One way to broaden the bandwidth over which $Z_{Th}$ will be sufficiently high for good array performance is to allow the inductance of the tuning inductor to vary during operation. As an example, a minimum of two values of inductance would be needed to increase the velocity-control bandwidth to about one octave. Thus a two-position switch would have to be activated to select one of the two values for the tuning inductor. Since it is usually desirable to locate the inductor in the same housing with the transducer, which may be under water at the far end of a long cable, the switching would have to be done by remote control, i.e., a relay would have to be used in the housing to be controlled by a switching signal provided at a long distance away. This has been considered to be an undesirable feature as it contributes to unwanted arcing in the circuit, noise in the receiving mode and the like. Consequently, a new way is desirable by which the process of remote control switching can be eliminated.

SUMMARY OF THE INVENTION

The objects and advantages of the present invention are accomplished by utilizing a fixed electrical network which presents to the transducer element either an inductor (when the transducer element is piezoelectric) which is primarily a shunt inductance or which is primarily a series inductance, without the need for short-circuiting the series inductor portion of the network or open-circuiting the shunt inductor portion of the network. This is accomplished by making use of a fixed electrical network or circuit for example, either a half-Tee network or a half-Pi network, in conjunction with an amplifier having a variable output impedance. This network provides a transducer element with, for example, an inductance which acts as a large shunt inductance when the amplifier behaves as a constant current source, i.e., having a high output impedance, as will be shown in FIG. 6; but which acts as a smaller series inductance when the amplifier behaves as a constant voltage source, i.e., having low output impedance, as will be shown in FIG. 7. Thus, not only is the effective inductance in the circuit varied in magnitude, but its apparent position is also changed from a primarily shunt inductance to a primarily series inductance. Furthermore, the ability of the amplifier to change its output impedance continuously, as a function of frequency, i.e., going gradually from a constant current source (high output impedance) to a constant voltage source (low output impedance) gives the fixed electrical network the additional property of enabling the effective magnitude of inductance to vary smoothly from one extreme value, associated with the constant current source mode, to the other extreme value, associated with the constant voltage source mode.

One object of this invention is to improve the performance of a transducer array over a broad bandwidth.

Another object of this invention is to eliminate remote control switching in the transmitting mode in the case of supplying power to a transducer array.

Still another object of this invention is to provide a fixed electrical network to maximize the transmission of power to various elements of a transducer array without degrading its performance, over a broader bandwidth than was possible in the past.

Another object of this invention is to eliminate remote control switching in the receiving mode of the transducer array without degrading the performance thereof over a broad bandwidth.

Other objects, advantages and novel features of the invention will become apparent from the following detailed description of the invention when considered in conjunction with the accompanying drawings wherein:

DESCRIPTION OF A PREFERRED EMBODIMENT

Figure 1:
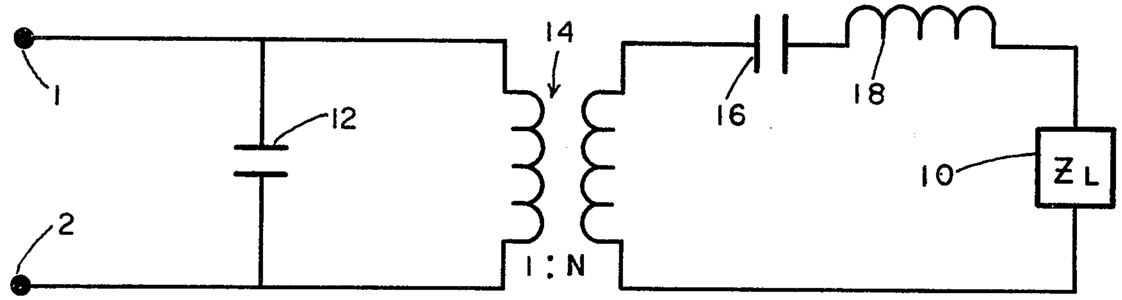
FIG. 1 represents an equivalent electric circuit of an untuned piezoelectric transducer element driving a radiation load.

Referring to the drawings wherein like reference characters designate identical or corresponding parts in various figures, and more particularly to the first figure thereof, FIG. 1 shows the equivalent electric circuit of an untuned piezoelectric transducer element, hereinafter called transducer, driving a radiation load 10. The capacitor 12 represents the blocked capacitance of the transducer, i.e., when mechanical motion of the transducer is blocked; the transformer 14 represents the electromechanical turns-ratio 1:N; the capacitor 16 represents the mechanical compliance when the electric terminals 1 and 2 of the transducer are short-circuited; and the inductor 18 represents the dynamic mass when the transducer operates around the mechanical resonance created by elements 16 and 18 when terminals 1 and 2 are short-circuited.

Figure 2:
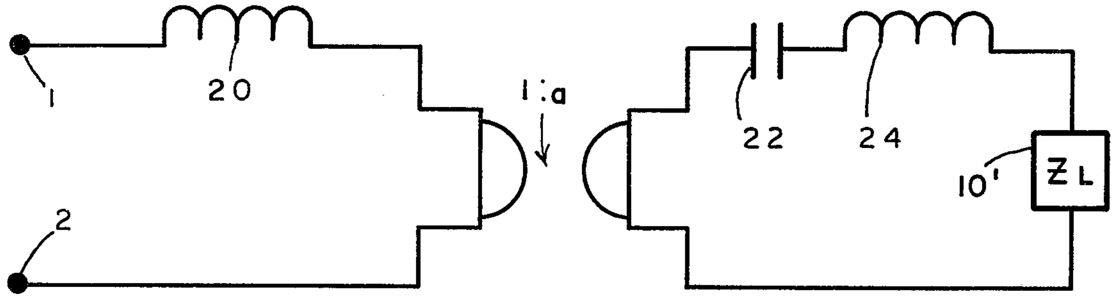
FIG. 2 represents an equivalent electric circuit of a magnetostrictive transducer element.

FIG. 2 shows the equivalent electric circuit of an untuned magnetostrictive transducer driving a radiation load 10'. The inductor 20 represents the blocked inductance of the transducer; the gyrator 1:a represents the electromechanical turns-ratio and is an impedance-inverting device, the capacitor 22 represents the mechanical compliance when the electric terminals 1 and 2 are open-circuited; and the inductor 24 represents the dynamic mass when the transducer operates around the mechanical resonance created by elements 22 and 24 when the terminals 1 and 2 are open-circuited.

Figure 3:
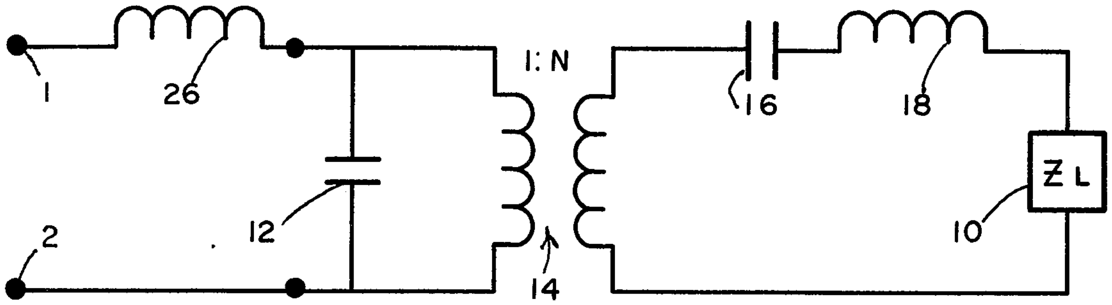
FIG. 3 represents a piezoelectric transducer element having a series inductor added to its circuit.
Figure 4:
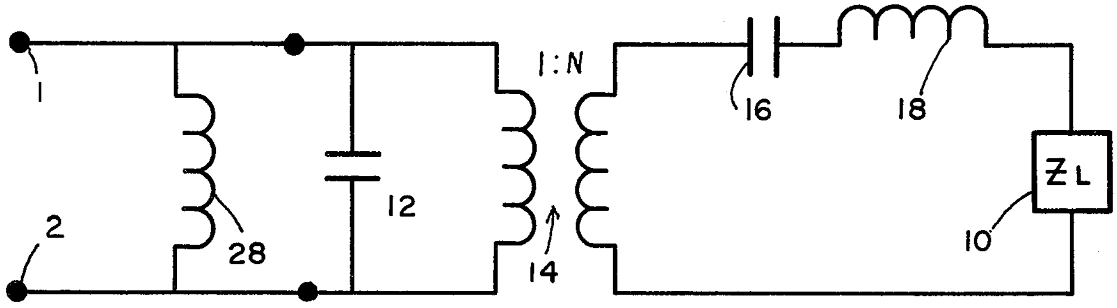
FIG. 4 represents a piezoelectric transducer element with a shunt inductor added to its circuit.

FIG. 3 shows the equivalent electric circuit of the piezoelectric transducer of FIG. 1 in conjunction with a series tuning inductor 26. FIG. 4 shows the equivalent electric circuit of the piezoelectric transducer of FIG. 1 in conjunction with a parallel or shunt tuning inductor 28.

Figure 5:
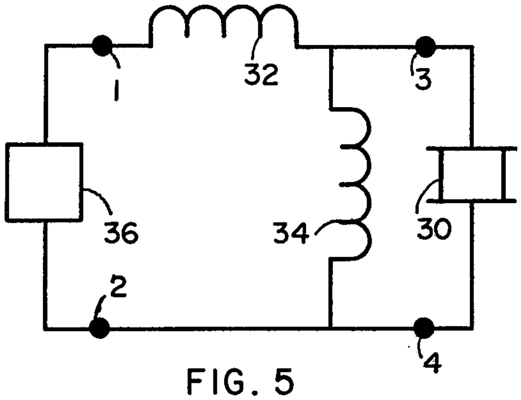
FIG. 5 represents a half-Tee network used with the equivalent circuit of a transducer element in conjunction with an amplifier of variable output impedance.
Figure 6:
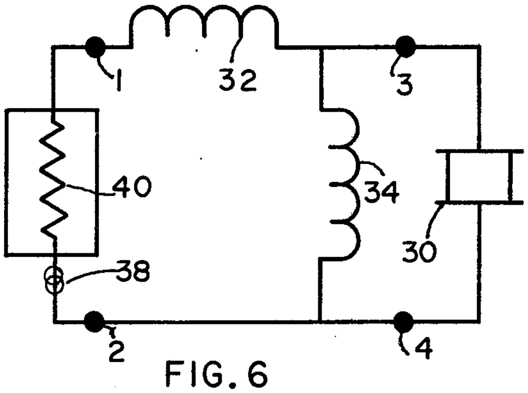
FIGS. 6 and 7 represent the equivalent circuits of FIG. 5 when the amplifier is used as a constant current source or high output impedance source and a constant voltage or low output impedance source respectively.
Figure 7:
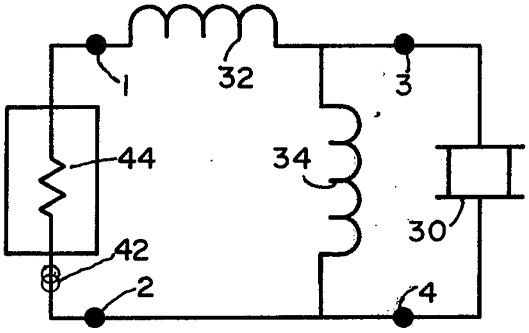

FIG. 5 shows the untuned piezoelectric transducer 30 in conjunction with the half-Tee network comprising inductors 32 and 34, driven by the generator 36. FIG. 6 shows the transducer and half-Tee network of FIG. 5 wherein the generator 36 is a voltage source 38 in series with a relatively high internal impedance 40, i.e., generator 36 acts like a constant current source. FIG. 7 shows the transducer and half-Tee network of FIG. 5 wherein the generator 36 is a voltage source 42 in series with a relatively low internal impedance 44; i.e., generator 36 acts like a constant voltage source.

Figure 8:
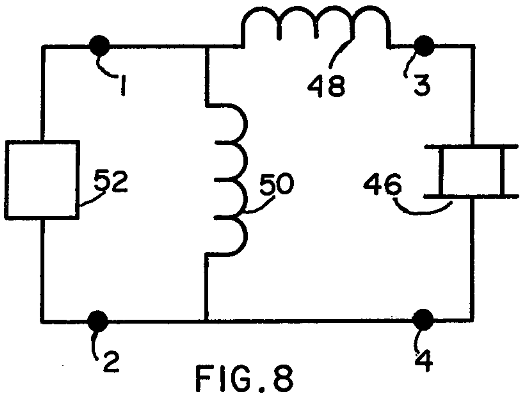
FIG. 8 shows a half-Pi network used with the equivalent circuit of a transducer element in conjunction with an amplifier of variable output impedance.
Figure 9:
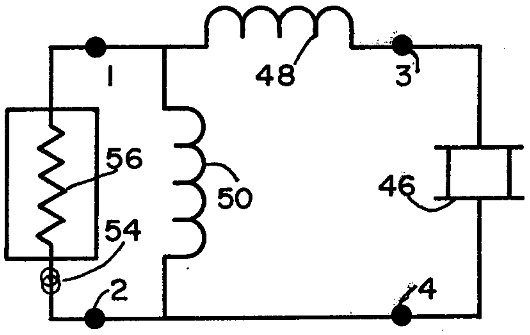
FIGS. 9 and 10 show the equivalent circuits of FIG. 8 when the amplifier is used as a constant current source or high output impedance source and constant voltage source or low output impedance source respectively.
Figure 10:
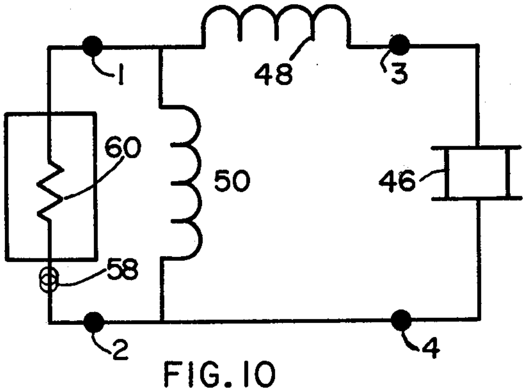

FIG. 8 shows the untuned piezoelectric transducer 46 in conjunction with the half-Pi network comprising inductors 48 and 50, driven by the generator 52. FIG. 9 shows the transducer and half-Pi network of FIG. 8 wherein the generator 52 of FIG. 8 is equivalent to a voltage source 54 in series with a relatively high internal impedance 56, i.e., when generator 52 acts like a constant current source. FIG. 10 shows the transducer and half-Pi network of FIG. 8 wherein the generator 52 of FIG. 8 is equivalent to a voltage source 58 in series with a relatively low impedance 60, i.e., generator 52 acts like a constant voltage source.

Besides input impedance, there is another parameter important in achieving velocity control. This parameter is "velocity phase" which is a shorthand term for the relative phase angle between the output velocity of the radiating face of the transducer, and the input current or voltage. The ratio of complex velocity to complex input current or voltage is called the transfer function. For the special case of velocity vs. voltage, this transfer function is called the transfer admittance.

Good velocity control in an array of transducers means that the spread in the velocity phase vs. frequency curves should be small, for different radiation impedances, i.e., the spread in the phase angles of the transfer functions at any frequency, for say four radiation impedances $Z_1$, $Z_2$, $Z_3$ and $Z_4$, should be small. In practice this spread is not small except over a limited bandwidth, and it is a purpose of this invention to increase this so-called velocity-control bandwidth.

Figure 11:
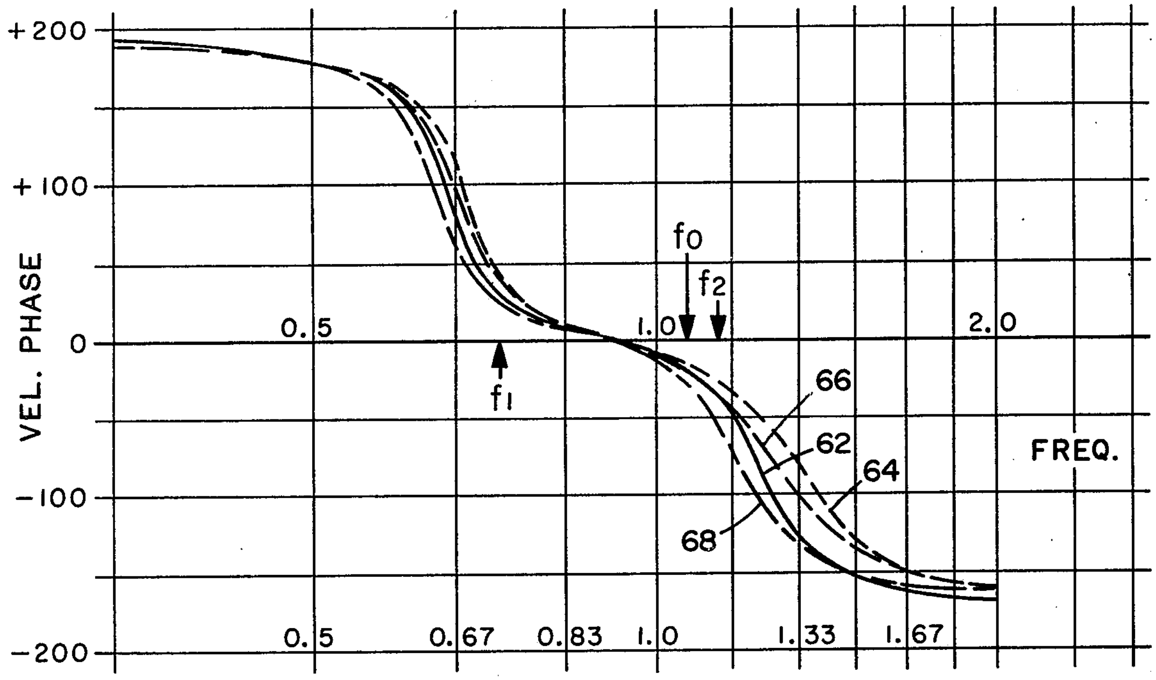
FIGS. 11 through 22 graphically represent velocity phase response and phase of $Z_{in}$ response at various frequencies in the range which are indicated on a normalized scale, where 1.0 is preferably chosen as the normalized reference frequency throughout.

In FIG. 11, the transfer function phase angle or "velocity phase" is plotted vs. frequency, for four different radiation impedances $Z_1$, $Z_2$, $Z_3$ and represented by curves 62, 64, 66 and 68 respectively. In this example, the transducer was tuned with a shunt inductance as shown in FIG. 4 to maximize the mechanical input impedance or $Z_{Th}$; and driven from a high-impedance amplifier, i.e., with so-called constant current drive from a constant current source. The tuning frequency had the normalized value of 0.9 which is below the mechanical resonance frequency $f_o$. The spread in phase angle of velocity phase curves is always small in the neighborhood of the tuning frequency which happens to have a value of 0.9 on the normalized scale in this case. This spread becomes larger on each side of the tuning frequency. The frequencies $f_1$ and $f_2$ were chosen as limiting frequencies beyond which the spread $\Delta\Phi$ in velocity phase would be too large. The value of $\Delta\Phi$ at the limits was about 15°. This is a value which allows good array performance, e.g., good beamforming, from an array of many individual transducer elements. Note that the velocity control bandwidth between $f_1$ to $f_2$ or about 0.73 and about 1.1 on the normalized scale is considerably narrower than the ordinary filter bandwidth which, in this case, ranges from about 0.67 to about 1.33, a range of about one octave.

Figure 12:
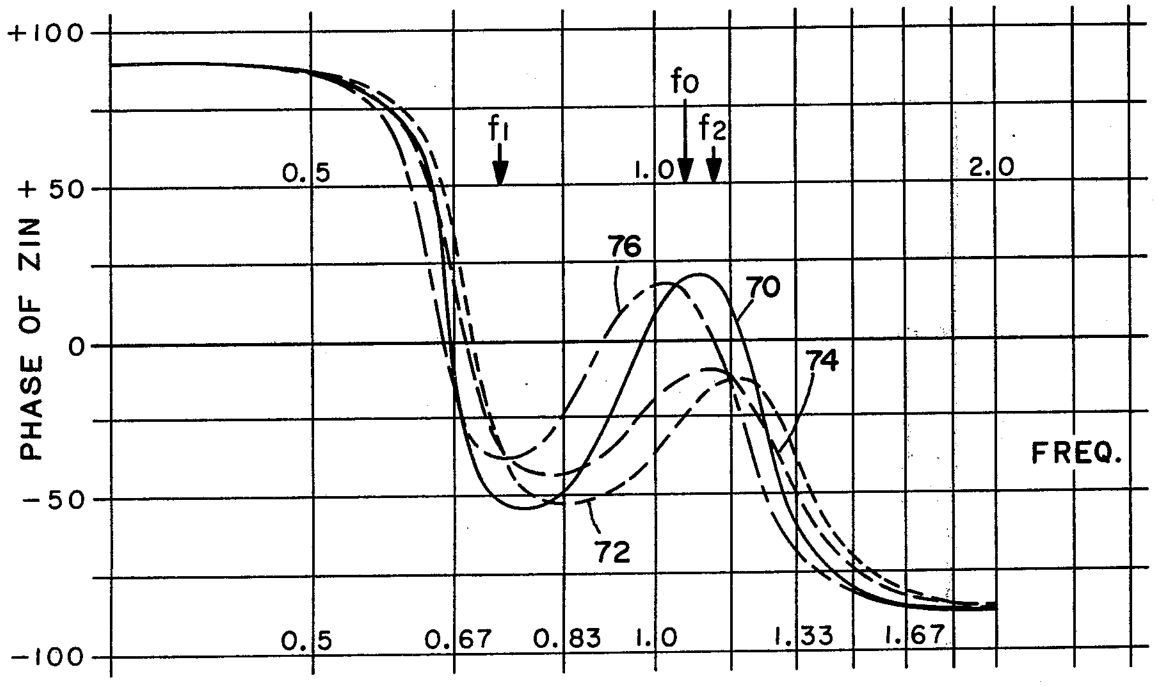

The transducer input impedance is another important parameter in the design of a useful transducer. The input impedance $\tilde{Z}_{in}$ can be represented as $|Z|e^{j\theta}$, where $|Z|$ is the magnitude of $\tilde{Z}_{in}$ and $\theta$ is the phase angle of $\tilde{Z}_{in}$. In FIG. 12, the input impedance phase angle or "Phase of $Z_{in}$" is plotted vs. frequency, for the four different radiation impedances $Z_1$, $Z_2$, $Z_3$ and $Z_4$, and shown by curves 70, 72, 74 and 76. The tuning frequency was the same as for FIG. 11. In FIG. 12 the important thing is not the spread between the four curves but rather the maximum excursion of the group, in both the positive and the negative direction. Thus in the frequency band between $f_1$ and $f_2$, the maximum excursion is no greater than 55°. This is considered good because an amplifier can deliver power to such an impedance with a power factor of cos 55° or 57%. Beyond this bandwidth the phase angle eventually gets larger, finally approaching 90° and zero power factor.

Figure 13:
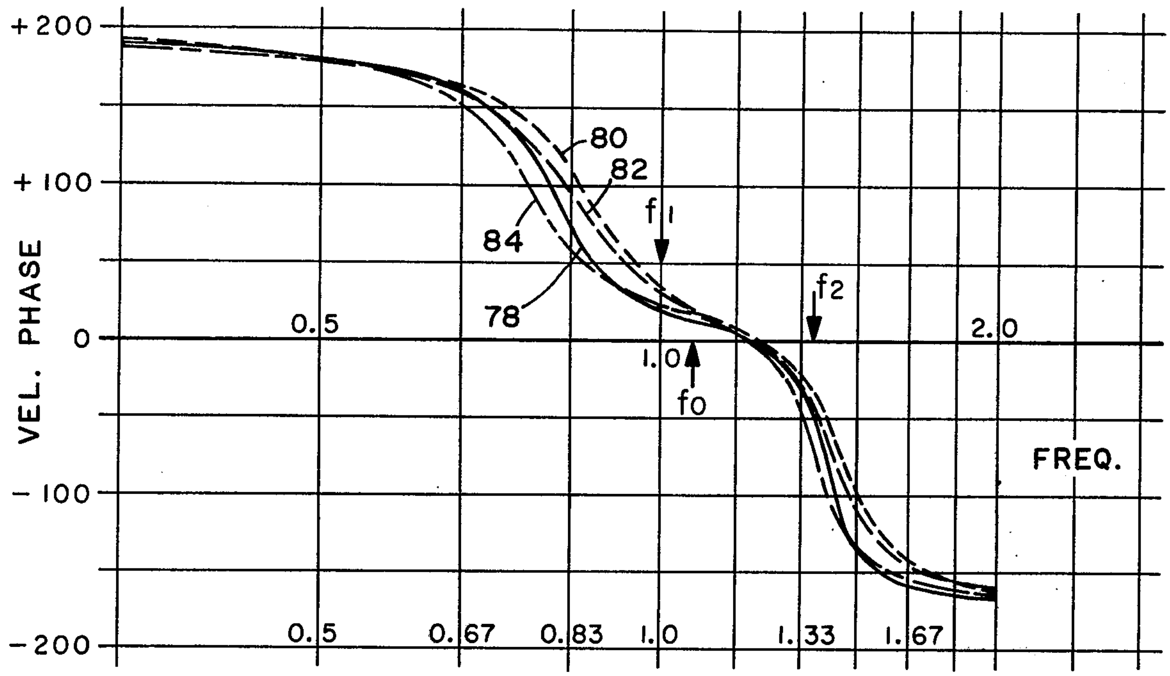

FIG. 13 shows the spread in transfer function phase angle of "velocity phase" for the same four radiation impedances as in FIG. 11 and represented by curves 78, 80, 82 and 84 respectively. The transducer was driven by a constant-current drive or source but tuned with a smaller shunt inductance than in the first case. The value of the tuning inductance was chosen to maximize the mechanical input impedance, $Z_{Th}$, at the frequency 1.23 on the normalized scale, which is above the mechanical resonance frequency $f_o$. The frequencies $f_1$ and $f_2$ were again chosen to limit the spread in phase $\Delta\Phi$ to about 15°. Here $f_1$ was about 1.0 and $f_2$ about 1.36 on the normalized scale. It can thus be seen that by using two different values of shunt inductance, one tuned to 0.9 covering the lower frequency band, and one tuned to 1.23 covering the upper frequency band, the overall band from about 0.73 to about 1.36 on the normalized scale is covered, giving a velocity-control bandwidth of nearly an octave.

Figure 14:
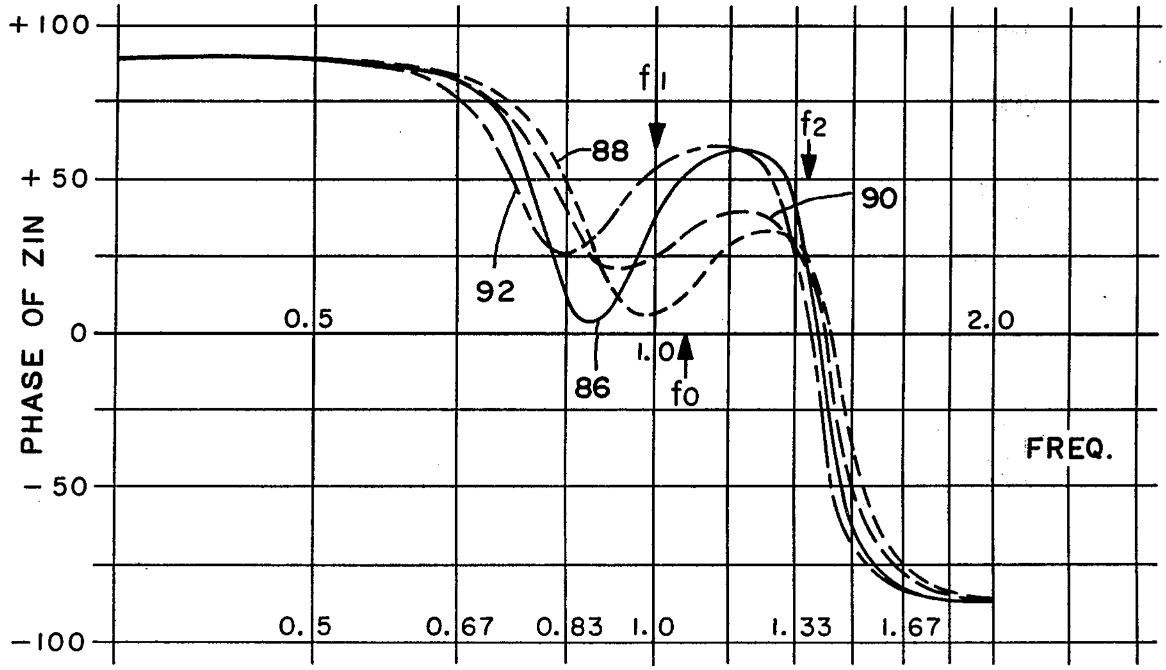

This second value of shunt inductance had to be examined to see if it modified the input impedance in an undesirable way. FIG. 14 shows the input impedance phase angle or "Phase of $Z_{in}$" for the same four radiation impedances as before and represented by curves 86, 88, 90 and 92 respectively. In the band between $f_1$ and $f_2$ or between 1.0 and 1.36 on the normalized scale, the maximum excursion of the group was greater than 60°. This was judged to be unacceptable because an amplifier would deliver power to such an impedance with a power factor less than cos 60°, i.e., less than 50%. Hence a way had to be found to reduce the maximum excursion of the group of input impedance phase curves in the upper frequency band, without affecting the "velocity phase" curves in that frequency band.

Figure 15:
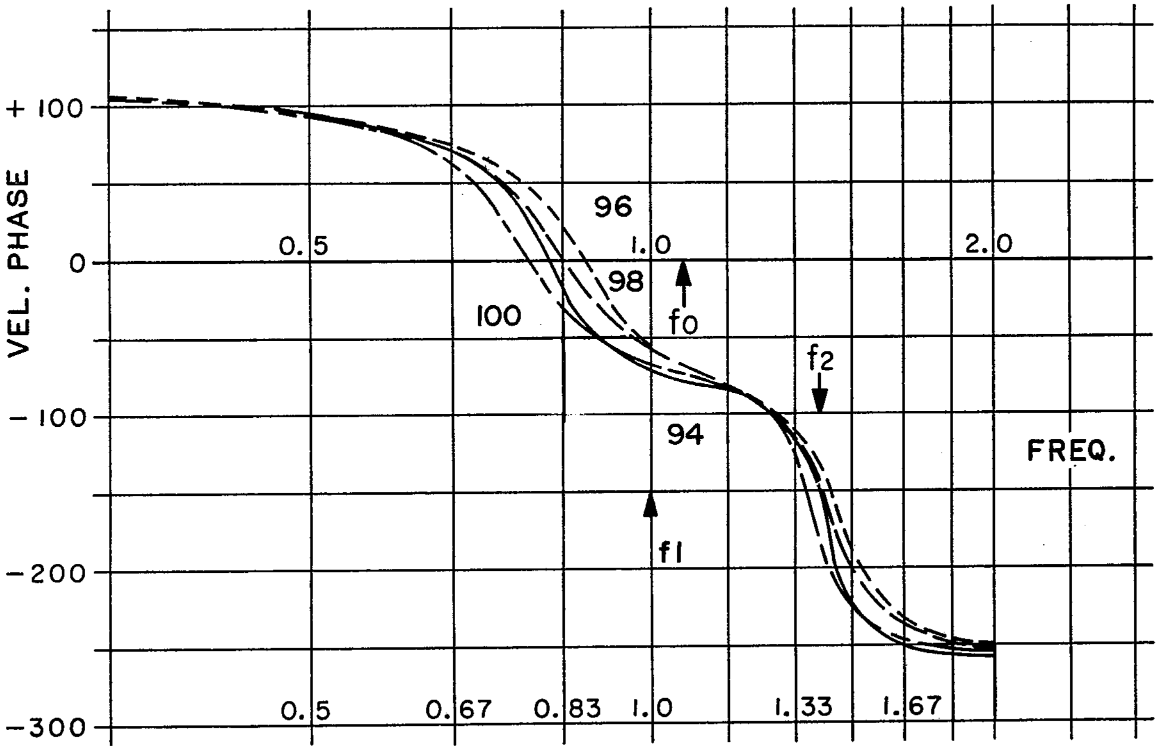
Figure 16:
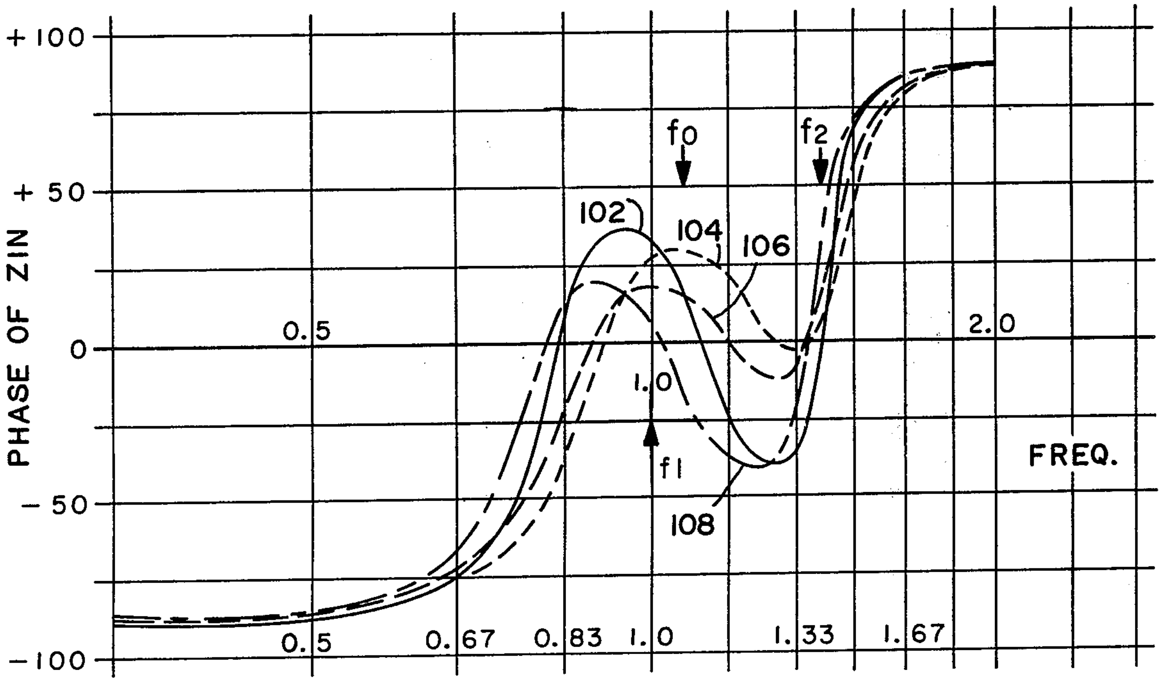

Now it can be shown that at any tuning frequency two methods are available to produce the same set of "velocity phase" curves, viz., a shunt inductance with a constant-current drive or source and a series inductance with a constant-voltage drive or source. But, although the two sets of velocity phase curves have identical spreads, the two sets of input impedance phase curves are quite different. This is illustrated in FIGS. 15 and 16 wherein FIG. 15 shows the spread in "velocity phase" or transfer function phase angle for the same four radiation impedances as in FIG. 13, when the transducer is tuned with a series inductance (as in FIG. 3) and driven by a constant-voltage drive or source. The value of the tuning inductance was chosen to maximize the mechanical input impedance or $Z_{Th}$ at the frequency 1.23 on the normalized scale exactly as in the case of FIG. 13. The curves are identical for the two cases except for a bias or downward shift of 90° for any constant-voltage drive situation. The spread of the curves within the group is identical for the two cases. However, a considerable difference shows up in the input impedance curves 102, 104, 106 and 108 of FIG. 16 which shows the group of input impedance phase angle curves for the same conditions as in FIG. 15. One effect of the series inductance is to produce an approximate mirror image of the earlier phase angle curves, as seen by comparing FIGS. 14 and 16. More important, however, is the fact that the group of phase angle curves of FIG. 16 is more or less symmetrically located about the 0° axis, whereas the group of curves of FIG. 14 is symmetrical about an axis located at about +30°. This is a very important difference for it means that in the upper band, when a series inductance and constant-voltage drive or source are used, the phase angle excursion of the group of curves can be confined between +30° and −40°. This means the power factor is greater than 60% over most of the upper band, unlike the group of FIG. 14 using the shunt inductance where the power factor was less than 50%.

Figure 17:
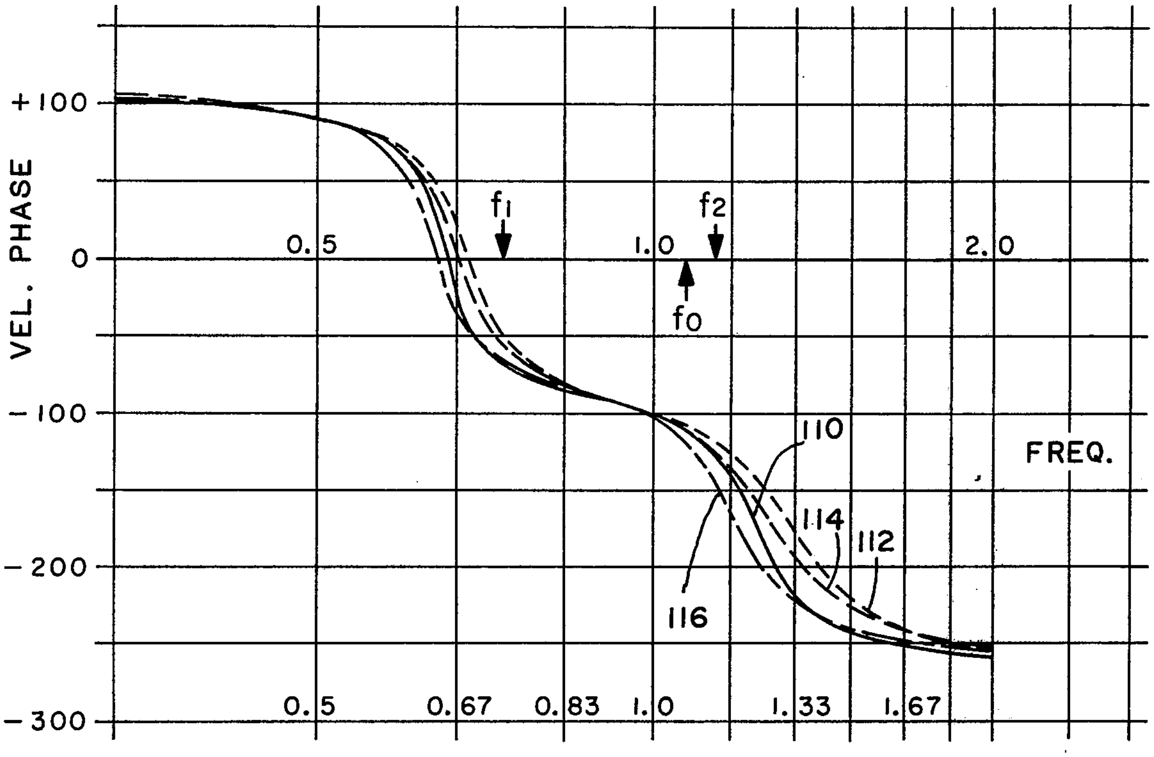
Figure 18:
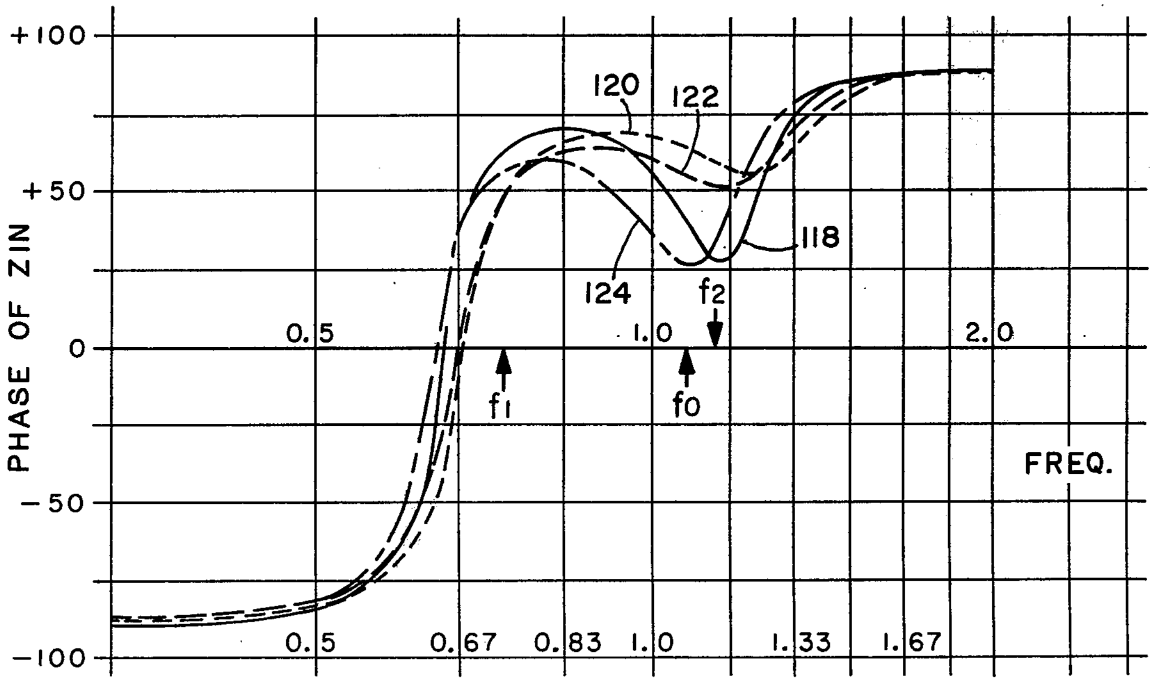

To complete the comparison between series turning and parallel tuning, FIG. 17 shows the case of a constant voltage source or drive with a series inductance tuned to maximize $Z_{Th}$ in the lower band at the frequency 0.9 as in FIGS. 11 and 12. The velocity phase curves 110, 112, 114 and 116 shown in FIG. 17 are identical with the respective curves of FIG. 11 except that instead of meeting at 0°, they now meet at −90°. The input impedance phase angle curves 118, 120, 122 and 124 are shown in FIG. 18 where it is seen that the axis of symmetry is approximately +45° and the spread is from +25° to +70° so that the power factor drops as low as 34%. This is to be contrasted with FIG. 12 which uses a shunt inductance where the power factor in the lower band never gets lower than 57% or cos 55°.

Thus it can be seen that the optimum performance occurs when the lower frequency band is tuned with a shunt inductance and driven by a constant current source, i.e., from a high output impedance amplifier as shown by curves in FIG. 12; and when the upper frequency band is tuned with a smaller series inductance and driven by a constant voltage source, i.e., from a low output impedance amplifier as shown by curves in FIG. 16.

One way to accomplish this is to have two independent inductors of values $L_1$ and $L_2$; and by means of a first switch, select the desired inductor; and by means of a second switch, place the selected inductor in series or in parallel. The switching would normally be done by remote control and the switches would be required to withstand high power.

Another way to accomplish this goal is to use a fixed network containing a series inductor and a parallel inductor, in either a half-Tee or half-Pi configuration, and to vary the effective value of the inductance as seen from the mechanical terminals 3 and 4, by varying the output impedance of the driving amplifier.

FIG. 5 shows the half-Tee network comprising the series inductor 32 and the shunt inductor 34. FIG. 6 shows the network of FIG. 5 when the driving amplifier has a high output impedance. This impedance is shown to the left of terminals 1 and 2, and the untuned transducer is shown to the right of terminals 3 and 4. The effective impedance of the network as seen by the transducer is found by looking to the left from terminals 3 and 4. In FIG. 6 this value would be the value of inductor 34 if the amplifier output impedance were infinite.

FIG. 7 shows the network of FIG. 5 when the driving amplifier has a low output impedance. This impedance is shown to the left of terminals 1 and 2. The effective impedance of the network as seen by the transducer is found by looking to the left from terminals 3 and 4. In FIG. 7 this value would be the value of the combination of inductors 32 and 34 in parallel if the amplifier output impedance were zero.

If the amplifier's output impedance is changed gradually from a very low value to very high value, the effective inductance will also change gradually from the value of inductors 32 and 34 in parallel to the value of the inductor 34 alone. This in turn will change the tuning frequency gradually and continuously from the upper value, e.g., a normalized frequency of 1.23 to the lower value, e.g., a normalized frequency of 0.9.

FIG. 8 shows the half-Pi network comprising the series inductor 48 and the shunt inductor 50. FIG. 9 shows the network of FIG. 8 when the driving amplifier has a high output impedance. The effective impedance of the network as seen by the transducer, looking to the left from terminals 3 and 4, would be the sum of the values of inductors 48 and 50 in series if the amplifier output impedance were infinite.

FIG. 10 shows the network of FIG. 8 when the driving amplifier has a low output impedance. The effective impedance of the network, looking to the left, would be simply the value of inductor 48 along if the amplifier output impedance were zero.

Figure 19:
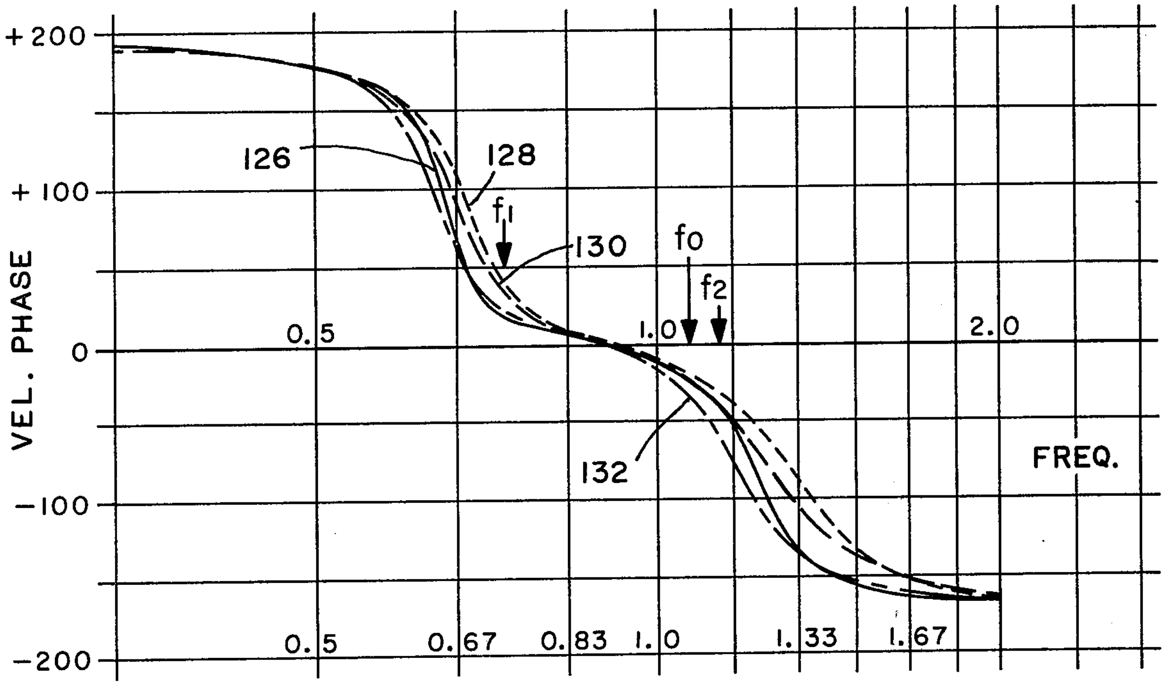
Figure 20:
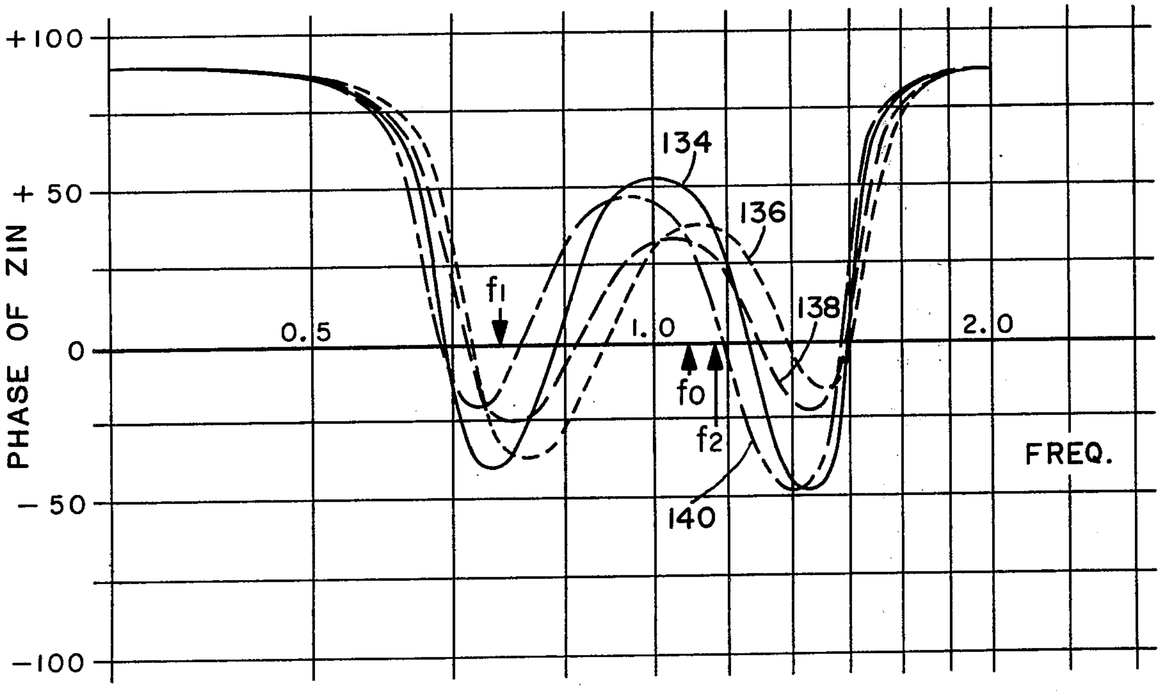

FIG. 19 shows the velocity phase curves 126, 128, 130 and 132 when either network, half-Tee or half-Pi, is driven from a high impedance amplifier with so-called constant-current drive or source. This group of curves is identical with the group shown in FIG. 11. FIG. 20 shows the group of input impedance phase angle curves 134, 136, 138 and 140 for either network, half-Tee or half-Pi. The frequency band of interest, for constant-current drive or source, is between $f_1$ and $f_2$. The spread extends from about −35° to about +55° in this band. This is no worse than the spread shown in FIG. 12.

Figure 21:
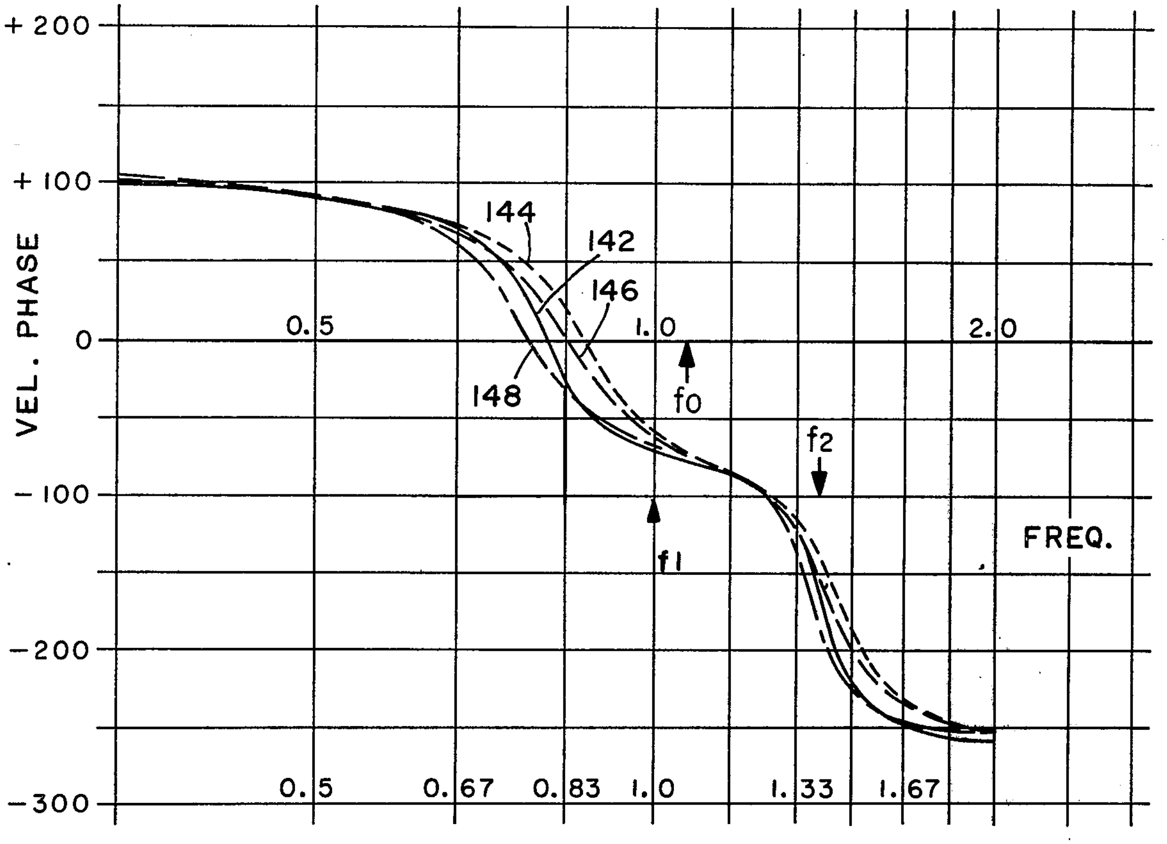
Figure 22:
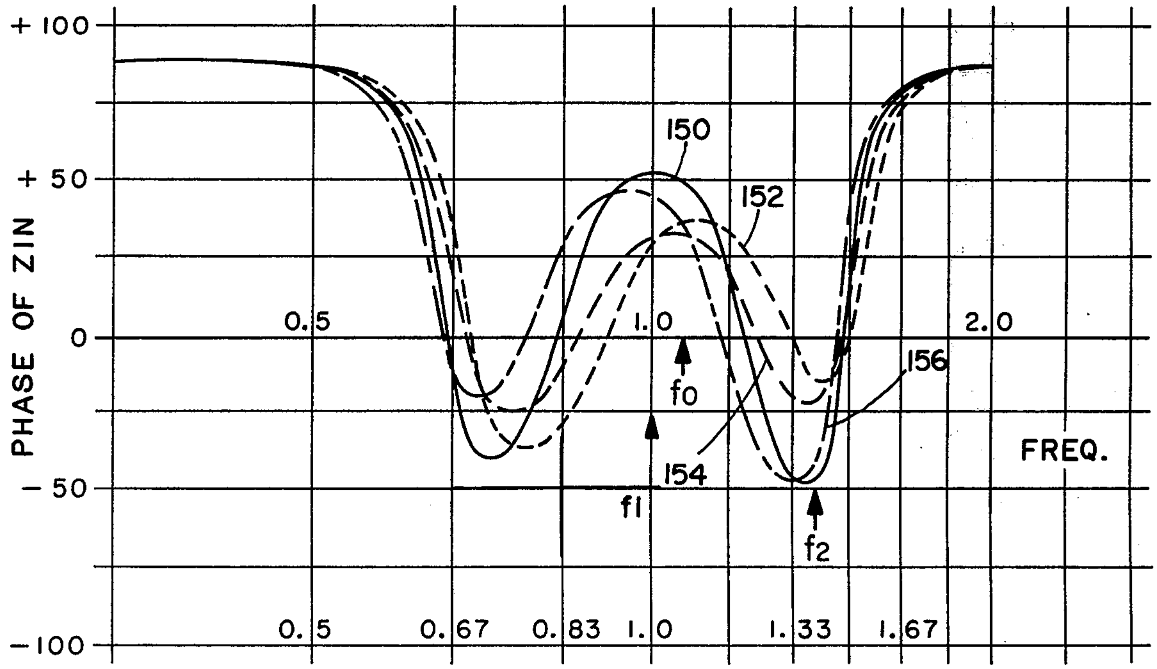

FIG. 21 shows the velocity phase curves 142, 144, 146 and 148 when either network, half-Tee or half-Pi, is driven from a low output impedance amplifier with so-called constant-voltage drive or source. This group of curves is identical with the group shown in FIG. 15. FIG. 22 shows the group of input impedance phase angle curves 150, 152, 154 and 156 for either network. The frequency band of interest, for constant-voltage drive or source, is between $f_1$ and $f_2$. The spread extends from about +50° to −50° in this band. This is only slightly worse than the spread shown in FIG. 16, and clearly superior to the spread shown in FIG. 14.

It should be noted that when a magnetostrictive transducer element is used, as shown in FIG. 2, and where the transformer ratio 1:N is replaced by gyrator 1:a or impedance-inverting transformer, all the analysis as described above in the case of a piezoelectric transducer element still holds after making the necessary changes. Thus, in the half-Tee network of FIG. 5, inductor element 32 becomes a series capacitor and inductor element 34 becomes a shunt capacitor. In the half-Pi network of FIG. 8, the inductor element 50 becomes a shunt capacitor and inductor element 48 becomes a series capacitor. The lower frequency band is now driven from a constant voltage amplifier, whereas the upper frequency band is now driven from a constant current amplifier. If the amplifier's output impedance is changed gradually from a very low value then referring to the half-Tee network; to a very high value, the effective capacitance will also change gradually from the value of the series and shunt capacitors in parallel, replacing inductors 32 and 34 in parallel, to the value of the shunt capacitor alone replacing the inductor 34 alone. This in turn will change the tuning frequency gradually and continuously from the lower value, e.g., a normalized frequency of 0.9, to the upper value, e.g., a normalized frequency of 1.23. A similar analysis holds for the half-Pi network.

A broad velocity-controlled bandwidth is just as important, in an array of transducer elements, for the "receive" mode as for the "transmit" mode. The reciprocity principle says that the circuit diagrams of FIGS. 5, 6, 7 and FIGS. 8, 9 and 10 are equally applicable to the "receive" mode, when the necessary changes are made. Thus in FIG. 5 the generator 36 becomes the receiving amplifier 36. In FIG. 6 the high internal impedance 40 of the generator 36 becomes the high input impedance 40 of the receiving amplifier. The voltage source 38 is suppressed, being replaced by a source incorporated within the transducer 30. In FIG. 7 the low internal impedance 44 of the generator 36 becomes the low input impedance 44 of the receiving amplifier. The voltage source 42 is suppressed, being replaced by a source incorporated within the transducer 30.

In FIG. 8 the generator 52 becomes the receiving amplifier 52. In FIG. 9 the high internal impedance 56 of the generator 52 becomes the high input impedance 56 of the receiving amplifier. The voltage source 54 is suppressed, being replaced by a source incorporated within the transducer 46.

In FIG. 10 the low internal impedance 60 of the generator 52 becomes the low input impedance 60 of the receiving amplifier. The voltage source 58 is suppressed, being replaced by a source incorporated within the transducer 46. It should be noted that the velocity-phase curves shown in FIGS. 11, 13, 15, 17, 19 and 21 are still just as applicable as they were in the discussion of the "transmit" mode. However, the electrical impedance curves shown in FIGS. 12, 14, 16, 18, 20 and 22 are not applicable for the "receive" mode.

Briefly stated, an electrical circuit for tuning and driving a broad bandwidth transducer array incorporating the teachings of this invention comprises a pair of inductors and an amplifier having a variable output impedance connected to form either a half-Tee network or a half-Pi network in the circuit including a piezoelectric transducer element. When the amplifier is used as a constant current source, i.e., when the amplifier has very high output impedance, the half-Tee network or the half-Pi network provides the transducer element with an inductance which acts as a large shunt inductance. On the other hand, when the amplifier is used as a constant voltage source, i.e., when the amplifier has very low output impedance, the half-Tee network or the half-Pi network provides the transducer element with an induction which acts as a smaller series inductance. The fixed half-Tee and half-Pi networks in conjunction with the variable output impedance of the amplifier thus broaden the bandwidth over which $Z_{Th}$ will be sufficiently high for good array performance without using any remote control switching. In case of a magnetostrictive transducer element, the electrical circuit for tuning and driving a broad bandwidth transducer array comprising magnetostrictive elements comprises a pair of capacitors and an amplifier having a variable output impedance, connected to form either a half-Tee network or a half-Pi network in the circuit including the magnetostrictive transducer element. In the receive mode, the equivalent electrical circuit is identical to that in the transmit mode after appropriate changes are made. Thus, a high input impedance receiving amplifier is substituted for the high output impedance amplifier used in the transmit mode and a low input impedance amplifier is substituted for the low output impedance amplifier used in the transmit mode.

Obviously many modifications and variations of the present invention are possible in the light of the above teachings. As an example, the design of the amplifier having variable output impedance may be chosen from various existing designs. Furthermore, the circuit may be used in the form of either a half-Tee network or a half-Pi network. The teachings of the present invention can also be used in the case of magnetostrictive transducer elements by using capacitive tuning elements instead of the inductive tuning elements used with the electrostrictive transducer elements. It is therefore understood that within the scope of the appended claims the invention may be practiced otherwise than as specifically described.

I claim:

1. A tuning and driving apparatus comprising:

a piezoelectric electroacoustic transducer element having a first terminal and a second terminal;

a passive half-Tee network including a first inductor having a first terminal and a second terminal and a second inductor having a first terminal and a second terminal, with the second terminal of said first inductor being connected to the first terminal of said second inductor and to the first terminal of said transducer element, and the second terminal of said second inductor being connected to the second terminal of said transducer element; and an amplifier having frequency dependent variable output impedance and having a first output terminal and a second output terminal, with the first output terminal of said amplifier being connected to the first terminal of said first inductor and the second output terminal of said amplifier being connected to the second terminal of said second inductor.

2. A tuning and driving apparatus comprising:

a piezoelectric electroacoustic transducer element having a first terminal and a second terminal;

a passive half-Pi network including a first inductor having a first terminal and a second terminal and a second inductor having a first terminal and a second terminal, with the first terminal of said first inductor being connected to the first terminal of said second inductor forming a junction point, the second terminal of said first inductor being connected to the second terminal of said transducer element and the second terminal of said second inductor being connected to the first terminal of said transducer element; and a frequency dependent variable output impedance amplifier having a first output terminal and a second output terminal, with the first output terminal of said amplifier being connected to the junction point of the first terminals of said first and second inductors, and the second output terminal of said amplifier being connected to the second terminal of said first inductor.

3. A tuning and driving apparatus comprising:

a magnetostrictive electroacoustic transducer element having a first terminal and a second terminal;

a passive half-Tee network including a first capacitor having a first terminal and a second terminal and a second capacitor having a first terminal and a second terminal, with the second terminal of said first capacitor being connected to the first terminal of said second capacitor and to the first terminal of said transducer element, and the second terminal of said second capacitor being connected to the second terminal of said transducer element; and a frequency dependent variable output impedance amplifier having a first output terminal and a second output terminal, with the first output terminal of said amplifier being connected to the first terminal of said first capacitor and the second output terminal of said amplifier being connected to the second terminal of said second capacitor.

4. A tuning and driving apparatus comprising:

a magnetostrictive electroacoustic transducer element having a first terminal and a second terminal;

a passive half-Pi network including a first capacitor having a first terminal and a second terminal and a second capacitor having a first terminal and a second terminal, with the first terminal of said first capacitor being connected to the first terminal of said second capacitor forming a junction point, the second terminal of said first capacitor being connected to the second terminal of said transducer element and the second terminal of said second capacitor being connected to the first terminal of said transducer element; and an amplifier having frequency dependent variable output impedance having a first output terminal and a second output terminal, with the first output terminal of said amplifier being connected to the junction point of the first terminals of said first and second capacitors, and the second output terminal of said amplifier being connected to the second terminal of said first capacitor.

5. A tuning and receiving apparatus comprising:

a piezoelectric electroacoustic transducer element having a first terminal and a second terminal;

a passive half-Tee network including a first inductor having a first terminal and a second terminal and a second inductor having a first terminal and a second terminal, with the second terminal of said first inductor being connected to the first terminal of said second inductor and to the first terminal of said transducer element, and the second terminal of said second inductor being connected to the second terminal of said transducer element; and an amplifier having frequency dependent variable input impedance and having a first input terminal and a second input terminal, with the first input terminal of said amplifier being connected to the first terminal of said first inductor and the second input terminal of said amplifier being connected to the second terminal of said second inductor.

6. A tuning and receiving apparatus comprising:

a piezoelectric electroacoustic transducer element having a first terminal and a second terminal;

a passive half-Pi network including a first inductor having a first terminal and a second terminal and a second inductor having a first terminal and a second terminal, with the first terminal of said first inductor being connected to the first terminal of said second inductor forming a junction point, the second terminal of said first inductor being connected to the second terminal of said transducer element and the second terminal of said second inductor being connected to the first terminal of said transducer element; and a frequency dependent variable input impedance amplifier having a first input terminal and a second input terminal, with the first input terminal of said amplifier being connected to the junction point of the first terminals of said first and second inductors, and the second input terminal of said amplifier being connected to the second terminal of said first inductor.

7. A tuning and receiving apparatus comprising:

a magnetostrictive electroacoustic transducer element having a first terminal and a second terminal;

a passive half-Tee network including a first capacitor having a first terminal and a second terminal and a second capacitor having a first terminal and a second terminal, with the second terminal of said first capacitor being connected to the first terminal of said second capacitor and to the first terminal of said transducer element, and the second terminal of said second capacitor being connected to the second terminal of said transducer element; and a frequency dependent variable input impedance amplifier having a first input terminal and a second input terminal, with the first input terminal of said amplifier being connected to the first terminal of said first capacitor and the second input terminal of said amplifier being connected to the second terminal of said second capacitor.

8. A tuning and receiving apparatus comprising:

a magnetostrictive electroacoustic transducer element having a first terminal and a second terminal;

a passive half-Pi network including a first capacitor having a first terminal and a second terminal and a second capacitor having a first terminal and a second terminal, with the first terminal of said first capacitor being connected to the first terminal of said second capacitor forming a junction point, the second terminal of said first capacitor being connected to the second terminal of said transducer element and the second terminal of said second capacitor being connected to the first terminal of said transducer element; and an amplifier having frequency dependent variable input impedance having a first output terminal and a second input terminal, with the first input terminal of said amplifier being connected to the junction point of the first terminals of said first and second capacitors, and the second input terminal of said amplifier being connected to the second terminal of said first capacitor.

* * * * *